US006528349B1

United States Patent
Patel et al.

(10) Patent No.: US 6,528,349 B1
(45) Date of Patent: Mar. 4, 2003

(54) MONOLITHICALLY-FABRICATED COMPLIANT WAFER-LEVEL PACKAGE WITH WAFER LEVEL RELIABILITY AND FUNCTIONALITY TESTABILITY

(75) Inventors: Chirag S. Patel, Peekskill, NY (US); Kevin Martin, Atlanta, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/697,031

(22) Filed: Oct. 26, 2000

Related U.S. Application Data
(60) Provisional application No. 60/161,437, filed on Oct. 26, 1999.

(51) Int. Cl.[7] ............... H01L 21/44; H01L 21/48; H01L 21/50
(52) U.S. Cl. ............... 438/117; 438/15; 438/106; 438/108; 438/117; 438/612; 438/613; 438/623; 438/624; 438/640
(58) Field of Search ............... 438/15, 612, 106, 438/613, 108, 623, 117, 624, 640

(56) References Cited

U.S. PATENT DOCUMENTS

| | | | | |
|---|---|---|---|---|
| 5,023,205 A | * | 6/1991 | Reche | 437/228 |
| 5,736,448 A | * | 4/1998 | Saia et al. | 438/393 |
| 6,187,615 B1 | * | 2/2001 | Kim et al. | 438/113 |
| 6,281,111 B1 | * | 8/2001 | Ohsumi | 438/623 |

OTHER PUBLICATIONS

Reed et al., Compliant Wafer Level Package (CWLP) With Embedded Air–gaps for Sea of Leads (SoL) Interconnections, School of Chemical Engineering, Georgia Institute of Technology, pp. 1–3.

Patel et al., Thermal Management in High Density 'Tiled' Compliant Wafer Level Packages, Microelectronics Research Center, Georgia Institute of Technology, pp. 1–21.

Patel et al., Optimal Printed Wiring Board Design For High I/O Density Chip Size Packages, Microelectronics Research Center, Georgia Institute of Technology, pp. 1–5.

Patel et al., Low Cost High Density Complaint Wafer Level Package, 2000 International Conf. on High–Density Interconnect and Systems Packaging, Apr. 26–28, 2000, Denver, Colorado, pp. 1–8.

Patel et al., Analysis of Thermal Management in the System Assembly of High Density Chip Size Packages, Microelectronics Research Center, Georgia Institute of Technology, pp. 32–39.

Patel et al., Reliability and Thermo–Mechanical Analysis of Complaint Wafer Level Package, Microelectronics Research Center, Georgia Institute of Technology, pp. 1–5.

(List continued on next page.)

*Primary Examiner*—Albert W. Paladini
*Assistant Examiner*—David A. Zarneke
(74) *Attorney, Agent, or Firm*—Thomas, Kayden, Horstemeyer & Risley, LLP

(57) ABSTRACT

Compliant wafer level packages 10 and methods for monolithically fabricating the same. A monolithically fabricated compliant wafer level package 10 having a compliant layer 14 and a compliant interconnect 30 passing therein. The compliant interconnects 30 being provided so that electrical and mechanical connections may be supported across the compliant layer 14, and constructed so that stresses related to relative motion between electrical components is accommodated. A method of providing a substrate 10 having a compliant layer 14, the compliant layer 14 having a via 20 that exposes a die pad 12 on the substrate 10. Fabricating a compliant interconnect 30 so that the compliant interconnect 30 contacts the die pad 12. The compliant interconnect 30 constructed so that electrical and mechanical connections may be supported through the compliant layer 14.

21 Claims, 7 Drawing Sheets-

OTHER PUBLICATIONS

Patel et al., Cost Anaylsis of Complaint Wafer Level Package, Electronic Components and Technology Conference, May 21–24, 2000, Las Vegas, Nevada, pp. 1–6.

Patel et al., Meeting the Heat Removal Requirements of 'Tiled' Complaint Wafer Level Packages, 2000 Electronic Components and Technology Conference, pp. 278–286.

Patel et al., An Analysis of the Gap Between PWB Technology and Chip I/O Interconnect Technology, and a New Wafer–Level Batch Packaging Concept, 1999 International Symposium on Microelectronics, pp. 611–618.

Patel et al., Compliant Wafer Level Package (CWLP), Semiconductor Packaging Symposium, Semicon West 99, San Jose, California, Jul. 13–14, 1999, pp. 1–8.

Patel et al., Performance Issues in High Density Printed Wiring Board design for High I/O Compliant Wafer Level Packages, Semiconductor Packaging Symposium, Semicon West 99, pp. C–1 through C–6.

Patel et al., Optimal Printed Wiring Board Design for High I/O Density Chip Size Packages, IPC Printed Circuits Expo, Mar. 14–18, 1999, Long Beach, California, pp. S02–2–1 through S02–2–5.

Naeemi et al., Performance Improvement Using On–Board Wires for On–Chip Interconnects, Microelectronics Research Center, Georgia Institute of Technology, pp. 325–328.

Naeemi et al., Sea of Leads: A Disruptive Paradigm for a System–on–a–Chip (SoC), 2001 IEEE International Solid–State Circuits Conference, pp. 280–281.

Bakir et al., Ultra High I/O Density Package: Sea of Leads (SoL), Microelectronics Research Center, Georgia Institute of Technology, sponsored by the Interconnect Focus Center (IFC) and funded in part by MARCO contract B–12–M00 and DARPA grant B–12–D00, pp. 1–5.

Patel, Compliant Wafer Level Package (CWLP), In Partial Fulfillment of the Requirements for the Degree of Doctor of Philosophy in Electrical Engineering, Nov., 2000, pp. 1–278.

* cited by examiner

MONOLITHICALLY-FABRICATED COMPLIANT WAFER-LEVEL PACKAGE WITH WAFER LEVEL RELIABILITY AND FUNCTIONALITY TESTABILITY

CROSS-REFERENCE TO RELATED APPLICATION

This application claims priority to copending U.S. provisional patent application entitled, "Monolithically Fabricated Compliant Wafer Level Package with Wafer Level Reliability and Functionality Testability," having ser. No. 60/161,437, filed Oct. 26, 1999, which is entirely incorporated-herein by reference.

FIELD OF THE INVENTION

The present invention is generally related to integrated circuit packaging, and more particularly, relates to methods and devices for providing compliant packaging for integrated circuits.

BACKGROUND OF THE INVENTION

The manufacturing process of an integrated circuit (IC) part can be summarized by the following three steps: I) IC fabrication, II) IC packaging, and III) IC testing. The IC fabrication, further classified into front-end and back-end processing, refers to the fabrication of the transistors and metal levels on the ICs in wafer form at the semiconductor foundry. The IC packaging involves packaging the IC to protect, power, and cool the IC and also provide electrical and mechanical connections between the IC and the outside world. The IC packaging is typically accomplished at a packaging foundry separate from the semiconductor foundry. Multiple testing protocols are used from the bare wafer state to fully fabricated and packaged IC state. Therefore, the IC testing involves both the semiconductor and the package foundries. In conventional electronic assembly, the wafer is subjected to simple testing procedures to identify functioning and non-functioning ICs at the end of the IC fabrication process. The wafer is then diced into individual ICs. The functional ICs are shipped to the package foundry to complete the package assembly process. The package assembly process begins at the package foundry where each IC goes through series of steps. The IC is first placed in a temporary package for electrical and reliability test and burn-in. Good ICs are disassembled from the temporary package and placed into a permanent package. Each package is tested once more for functionality before it is approved for system assembly. The package assembly and testing procedures beyond wafer scribing involve one IC at-a-time, significantly increasing the cost of producing the packaged IC.

As well, these packaged ICs are generally incorporated into electronic devices by mounting the ICs on substrates, such as printed wiring boards (PWBs). These PWBs physically support and electrically connect the ICs to other elements in the circuit. The structures utilized to connect the IC to the substrate accommodate the electrical and mechanical interconnections to the chip and are commonly referred to as input/output connections (I/O). Normally, these I/O connections are subject to substantial stresses due to the thermal cycling as the temperatures within the electrical device cycle during operation. For example, electrical power dissipated during operation tends to heat up both the substrate and the associated IC, then both the IC and substrate cool as power is secured to the electrical device. In that the substrate and the IC are generally constructed of different materials having different coefficients of thermal expansion, the IC and substrate will expand and contract by different amounts and at different rates. This motion of the IC relative to the substrate can cause movement of the I/O connections and place them under mechanical stress. Repeated occurrence of these stresses may cause breakage of the I/O connections and ultimate failure of the IC.

Thus, heretofore unaddressed needs exist in the industry to address the aforementioned deficiencies and inadequacies.

SUMMARY OF THE INVENTION

The present invention provides an apparatus and method for producing compliant wafer level packages.

Briefly described, one aspect the present apparatus can be described as a monolithically fabricated compliant wafer level package (CWLP) for packaging electronic devices, having a compliant layer with a first surface parallel to a second surface, and a compliant interconnect passing between the first surface and the second surface of the compliant layer. The compliant interconnects being provided so that electrical and mechanical connections may be supported across the compliant layer. Preferably, the compliant interconnect further comprises a substantially vertical portion and a portion that is substantially horizontal to the first surface and the second surface of the compliant level, thereby accommodating relative motion between elements disposed on opposing sides of the compliant layer, yet electrically and mechanically connected by the compliant interconnect.

The present invention can also be viewed as providing a method for monolithically fabricating compliant wafer level packages. In this regard, the method can be broadly summarized by providing a substrate having a compliant layer on a first side, the compliant layer having a via that exposes a die pad along the first side of the substrate, and fabricating a compliant interconnect so that a first end of the compliant interconnect contacts the die pad. In fabricating the compliant interconnect, further optional but preferred steps include providing a substantially vertical portion of the compliant interconnect contacting the die pad and providing a substantially horizontal portion of the compliant interconnect that contacts the upper surface of the compliant layer.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
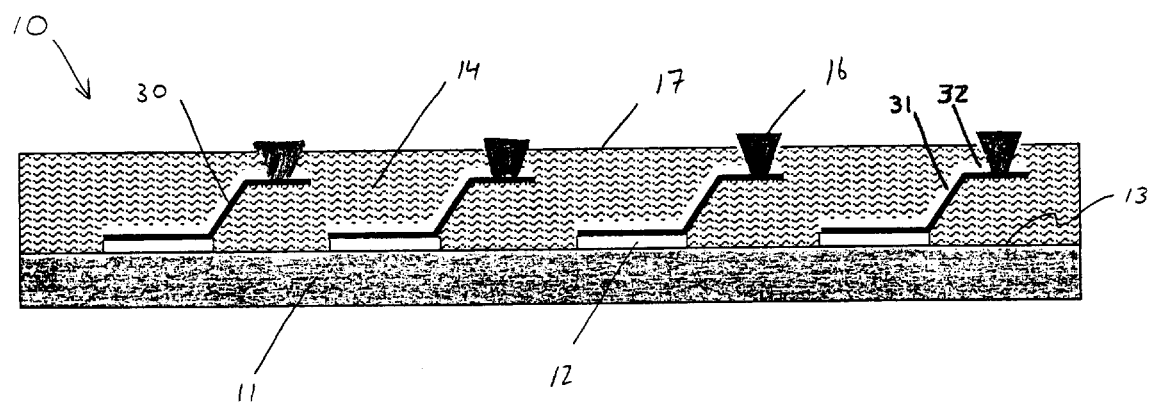
FIG. 1 shows a side view of one embodiment according to the present invention.

Turning now to the drawings, FIG. 1 presents a side view of one of many possible embodiments of the present invention. This embodiment of a compliant wafer level package (CWLP), which is denoted by reference numeral 10, comprises a substrate 11 on which one or more (typically numerous) die pads 12 are disposed on a first surface 13. A compliant layer 14, preferably a polymeric material with desirable dielectric properties, is disposed on the first surface 13 of the substrate 11 as well. One or more compliant interconnects 30, each of which is connected at one end to a respective die pad 12, traverse the compliant layer 14 so that the associated die pad 12 is electrically connected to a solder bump 16 disposed on an upper surface 17 of the compliant layer 14. Preferably, the compliant interconnect 30 further comprises a substantially vertical portion 31 and a substantially horizontal portion 32 that is generally parallel to the first surface 13 of the substrate 11 and the upper surface 17 of the compliant layer 14. The compliant layer 14 and compliant interconnects 30 accommodate relative motion between the CWLP 10 and a related supporting substrate, i.e., a system board 40 (FIGS. 3A–3B) or test probe card 50 (FIGS. 4A–4B), during testing of the CWLP 10 or system operation wherein a portion of the CWLP 10 has been incorporated.

Referring now to FIGS. 2A through 2I. the CWLP monolithic fabrication process begins with the completion of the fabrication process of the integrated circuits (ICs) (not shown, disposed between substrate 11 and die pads 12). Monolithic fabrication means that all of the steps required to produce the final CWLP 10 will be performed on the initial substrate 11 that supports the ICs and associated die pads 12. At this stage of the process, a substrate 11, such as silicone, exists with a number of die pads 12 disposed thereon, the die pads 12 serving to support electrical connections between external structures, i.e., test cards and PWBs, and the IC associated with the given die pad 12. The substrate 11 and die pads 12, and any other layers or materials added thereto during the compliant wafer level packaging process, are referred to herein as a wafer 18, with the finished product being referred to as a CWLP 10.

Figure 2A:
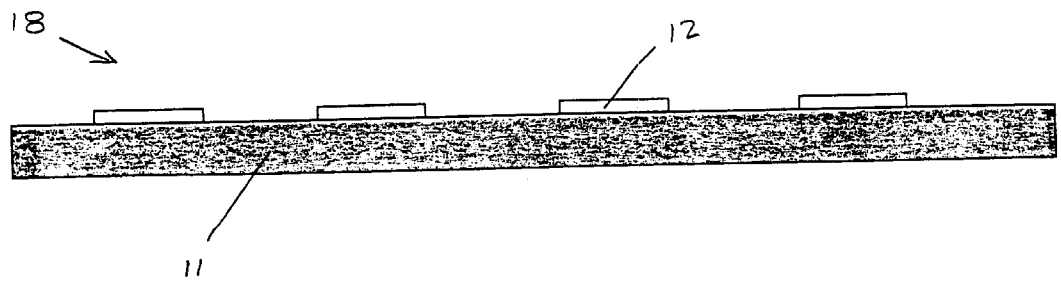
FIGS. 2A–2I show side views of the various stages in the process of fabricating a compliant wafer level package in accordance with the embodiment of FIG. 1.
Figure 2B:
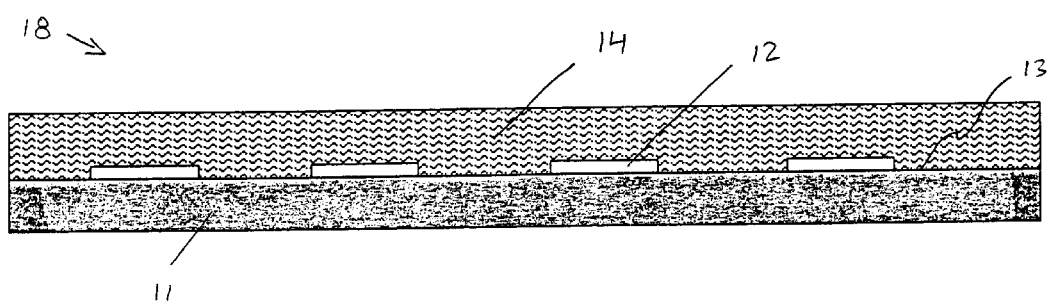
Figure 5:
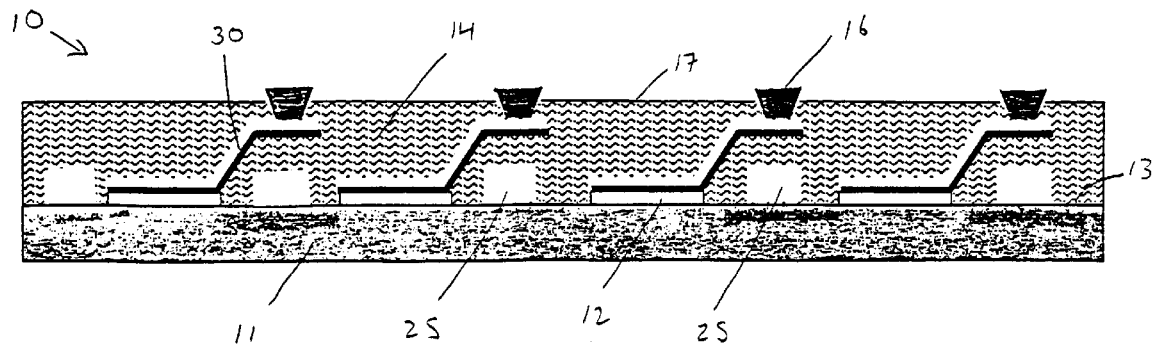
FIG. 5 shows a side view of the embodiment of the present invention of FIG. 1, where components have been incorporated in the compliant wafer level package.

The first step in the process involves applying a compliant layer 14 of material to the first surface 13 of the substrate 11 containing the die pads 12, as seen in FIG. 2B. The compliant layer 14 serves a number of important functions, such as: encapsulating the IC to protect it from environmentally induced reliability failures caused by moisture, contaminants, mobile ions, ultraviolet, visible, and alpha-particle radiations, heat, humidity, severe cold, etc.; providing mechanical support and a low stress medium to the embedded compliant interconnects 30; supporting vertical compliance for wafer level testability; providing a low dielectric medium for compliant interconnects 30; and providing the ability to incorporate various components 25 (FIG. 5) like integrated passives (such as resistors, capacitors, inductors), decoupling capacitors, and Radio Frequency (RF) components in the compliant layer 14. As well, a material chosen for the compliant layer 14 should have a high glass transition temperature, and be compatible with silicon and metal surfaces, such as copper (Cu), gold (Au), titanium (Ti), nickel (Ni), aluminum (Al), and any other metal used in the IC, compliant package, and PWB manufacturing process.

In the instant case, the compliant layer 14 is formed from a low modulus polymeric material of approximately 25 $\mu$m in height. The compliant material is spin coated onto the wafer 18, the spin speed and time being adjusted to achieve the desired thickness of the compliant layer 14. In addition to spin coating, any of a number of acceptable techniques, or combinations thereof, including but not limited to lamination, meniscus coating, extrusion coating, spray coating, or doctor blading, may be used to apply the compliant layer 14 to the wafer 18.

Figure 2C:
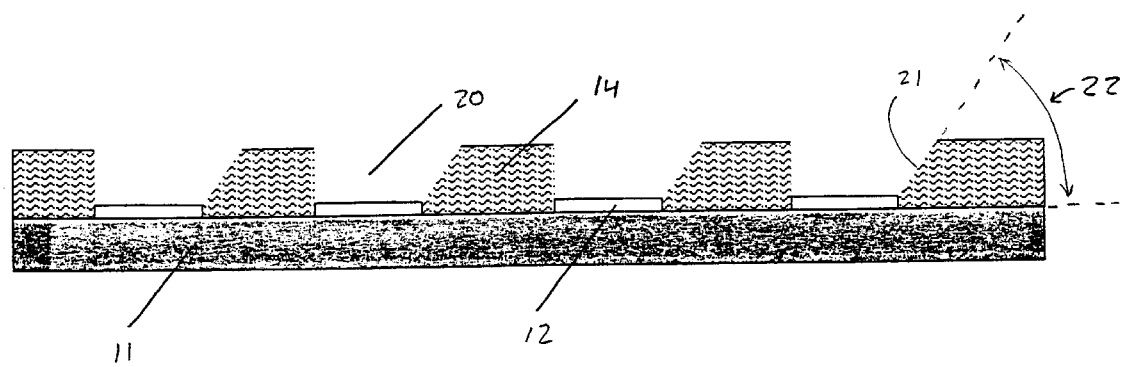

Next, the die pads 12 on the surface of the substrate 11 are exposed, as depicted in FIG. 2C. This is accomplished by producing vias 20 in the compliant layer 14. Once again, various techniques are available to accomplish this, and which one is used may depend on what compliant material has been selected for the compliant layer 14. If the compliant material is photodefinable, the photolithographic process may be utilized. First, using photolithographic equipment, the compliant layer 14 is exposed through a via mask with ultraviolet radiation at the prescribed exposure dose. If the compliant material is negative photosensitive, then the exposed area is strengthened by UV radiation and the unexposed area can be etched away by dissolving the polymer in a solvent. If the compliant material is positive photosensitive, then the exposed area is weakened by UV radiation and it can be etched by dissolving the polymer in a solvent. If, however, the compliant material is not photodefinable, it can be etched into vias 20 by using techniques such as wet etching, dry etching (to include plasma or reactive ion etching), or laser ablation. Note that the angle 22 of the via 20 sidewall 21 that will ultimately support the substantially vertical portion 31 (FIG. 1) of the compliant interconnect 30 may be controlled to obtain the desired vertical and horizontal compliance. In the present embodiment, an angle 22 of 75 degrees to 80 degrees as defined by the via sidewall 21 and the substrate 11 was preferred, but this angle can vary depending upon the embodiment. After the completion of via etching process, the material should be cured if required. Here, standard polymer curing in a nitrogen purged convective curing oven was used.

Figure 2D:
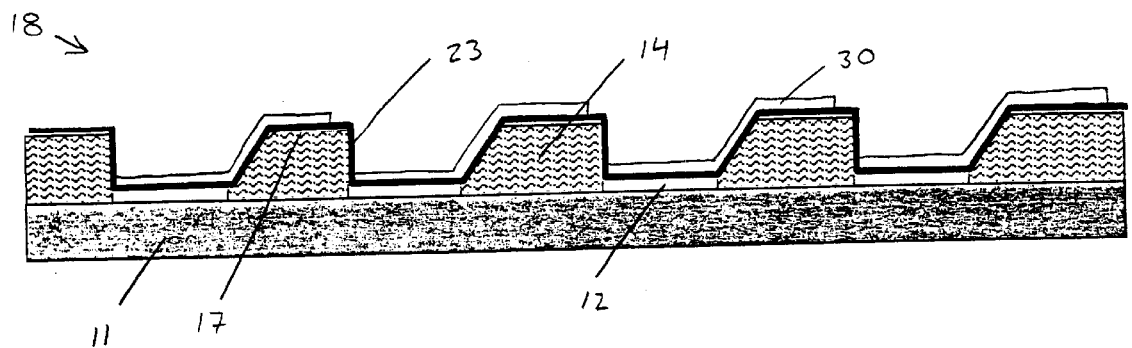
Figure 2E:
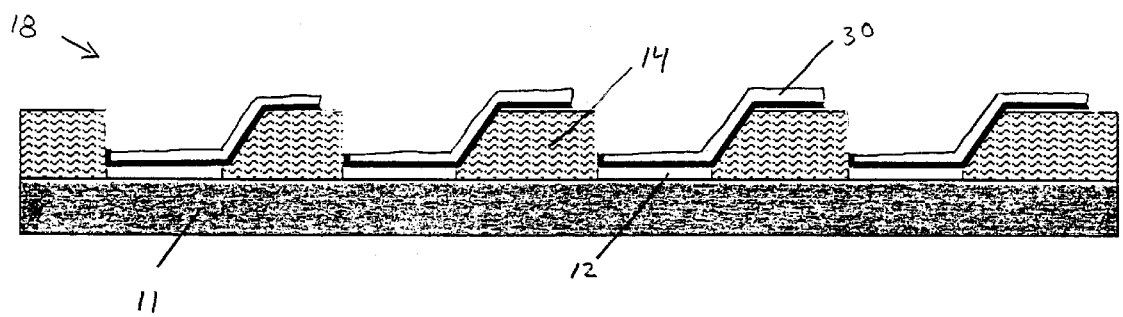
Figure 2F:
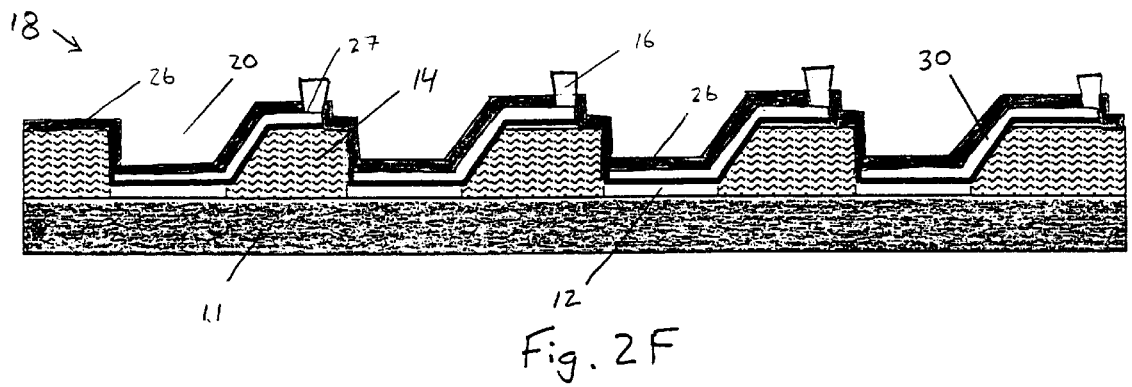
Figure 2G:
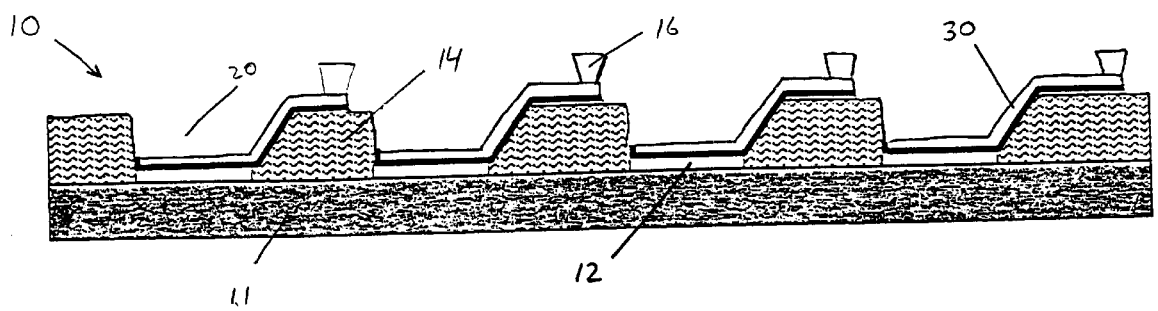

Referring now to FIG. 2D, the next step in the process is fabricating the compliant interconnects 30. In the preferred embodiment, the wafer 18 is next sputter coated with Titanium/Copper (Ti/Cu) or Titanium/Gold (Ti/Au) to form a first metal seed layer 23 to be used for electroplating copper or gold compliant interconnects 30, respectively. The titanium is used to improve the adhesion of the compliant interconnects 30 to the underlying compliant material, forming the compliant layer 14, and also as a barrier metal. The first metal seed layer 23 is disposed on the upper surface 17 of the compliant layer 14. As an alternative to a first metal seed layer 23, any other material that can provide these functions can be used. As alternatives to sputtering, the first metal seed layers 23 can also be deposited on the wafer 18 by evaporation, electroplating, or electroless plating.

A photoresist is spin coated on the first metal seed layer 23 and using a photolithographic mask, "serpentine,"

"zigzag," or "step" shapes (FIGS. 6A–6G) are patterned into the photoresist. To form the compliant interconnects 30, copper is deposited in these patterns by using electroplating. Any other electrically and thermally conductive material can be used as an alternative to copper. As an alternative to electroplating, the electrically and thermally conductive material forming the compliant interconnects 30 can be screen printed, electroless plated, evaporated, or sputtered to form compliant interconnects 30. In this one step, all of the compliant interconnects 30 on the wafer 18 were created simultaneously. The compliant interconnects 30 of the present embodiment are about 50 μm in width and about 10 μm thick. Note, however, that the dimensions of the compliant interconnects 30 may vary depending on the embodiment. After fabrication of the compliant interconnects 30 is complete, the photoresist and first metal seed layer 23 used in the process are removed, leaving the wafer 18 as it appears in FIG. 2E.

After fabricating the compliant interconnects 30, a selection whether to embed the leads in compliant material or to leave the compliant interconnects 30 exposed is made. In case of non-embedded compliant interconnects 30, FIG. 2F, the wafer 18 is sputter coated with a Titanium/Copper (Ti/Cu) second metal seed layer 26 to be used for electroplating Tin/Lead (Sn/Pb) solder bumps 16 as electrical connectors. As an alternative to second metal seed layer 26, any other material that can provide these functions can be used. As well, as an alternative to sputtering, the second metal seed layer 26 can be deposited on the wafer 18 by evaporation, electroplating, or electroless plating. A photoresist layer is then spin coated on the second metal seed layer 26 and using a photolithographic masking step, solder bump vias 27 are etched into the photoresist and solder bumps 16 are electroplated, preferably to a thickness of about 35 μm. The solder bumps 16 can also be screen printed, electroless plated, evaporated, sputtered, or applied through other techniques. Different types of conductive adhesives or any other thermally and electrically conductive material can be used as an electrical connector rather than solder bumps 16. Once the photoresist and second metal seed layer 26 used for fabrication of the solder bumps 16 are removed, the embedded CWLP process is complete, and a CWLP 10 exists as it appears in FIG. 2G.

Figure 2H:
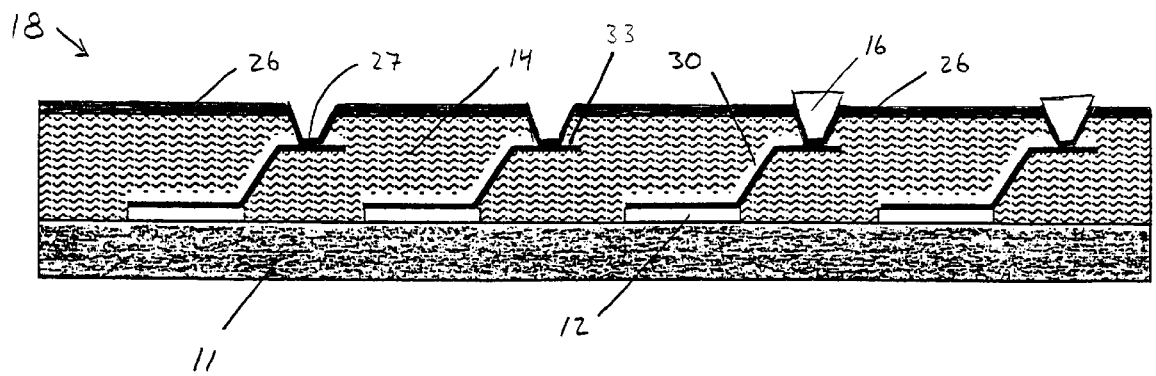
Figure 2I:
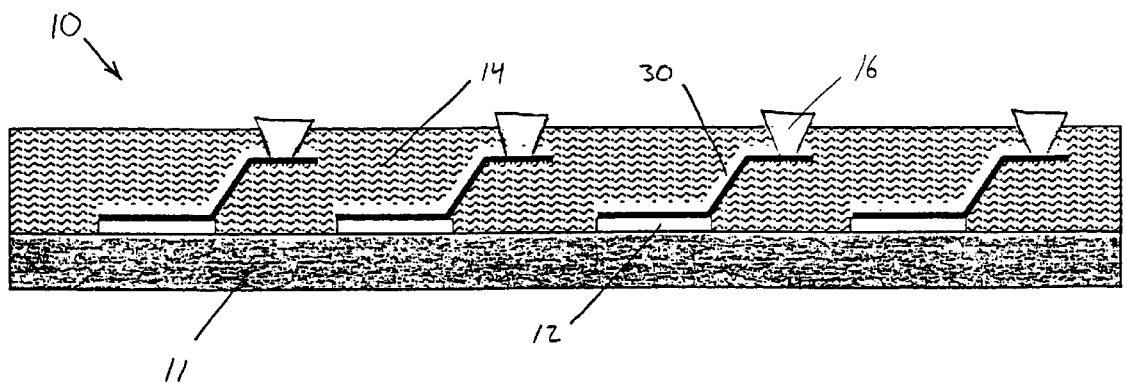

Referring now to FIG. 2H, embedded compliant interconnects 30 will now be addressed. After the compliant interconnects 30 have been fabricated, the photoresist and first metal seed layer 23 (FIG. 2D) used for compliant interconnects 30 is removed. The compliant interconnects 30 are then embedded in the compliant material used to construct the compliant layer 14. In the preferred embodiment, the layer of compliant material deposited will be about 15 μm thick. The same methods that were previously discussed for use with producing the compliant layer 14 may be generally used to produce this layer of compliant material for embedding the compliant interconnects 30. Further, generally the same methods that were used to create the vias 20 (now filled with compliant material) in the compliant layer 14 may now be used to expose the distal ends 33 of the compliant interconnects 30 in relation to the ends connected to the die pads 12.

Lastly, the wafer 18 is sputter coated with a Titanium/Copper (Ti/Cu) second metal seed layer 26 to be used for electroplating Tin/Lead (Sn/Pb) solder bumps 16 as electrical connectors. As an alternative to second metal seed layer 26, any other material that can provide these functions can be used. As well, as an alternative to sputtering, the second metal seed layer 26 can be deposited on the wafer 18 by evaporation, electroplating, or electroless plating. A photoresist layer is then spin coated on the second metal seed layer 26 and using a photolithographic masking step, solder bump vias 27 are etched into the photoresist and solder bumps 16 are electroplated, preferably to a thickness of about 35 μm. The solder bumps 16 can also be screen printed, electroless plated, evaporated, sputtered, or applied through other techniques. Different types of conductive adhesives or any other thermally and electrically conductive material can be used as an electrical connector rather than solder bumps 16. Once the photoresist and second metal seed layer 26 used for fabrication of the solder bumps 16 are removed, the embedded CWLP process is complete, and a CWLP 10 exists as it appears in FIG. 2I.

Figure 3A:
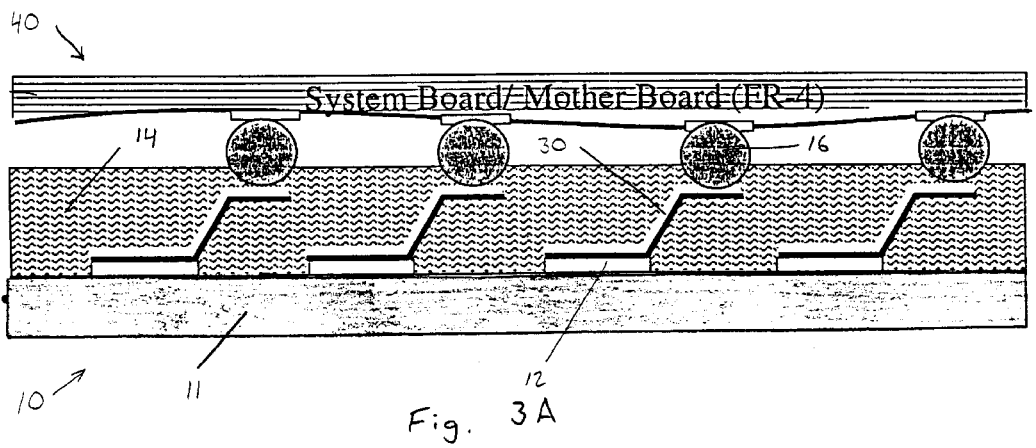
FIGS. 3A and 3B depict a side view of the horizontal compliance provided by a compliant wafer level package shown in FIG. 1, when incorporated within an electronic structure.
Figure 3B:
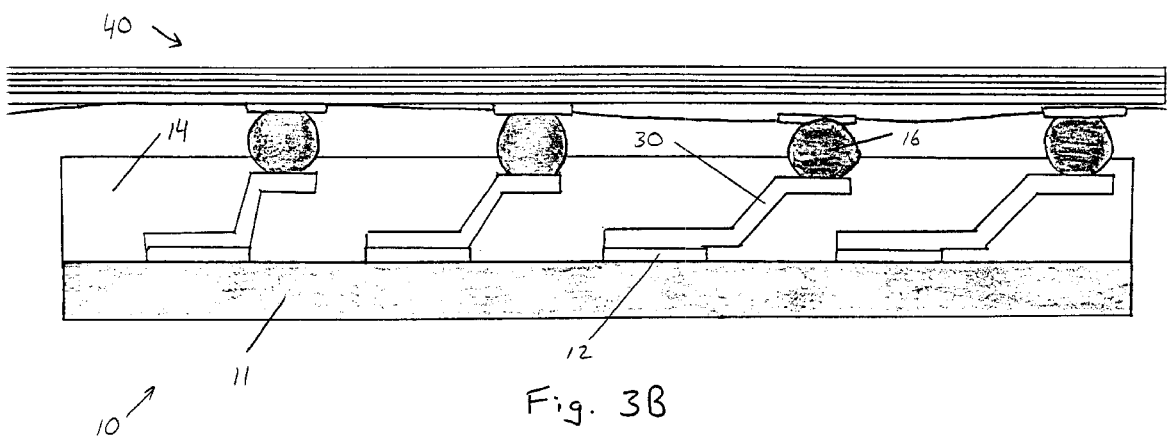

The compliant interconnects 30 and compliant layer 14 of the CWLP 10 allow for accommodation of relative motion both vertically and in a horizontal plane that is substantially parallel to the surface of the compliant layer 14. Compliance is desired for assembly of electronic components without the use of underfill and for wafer level testability. Generally, underfill is used to absorb the thermo-mechanical stress resulting from the coefficient of thermal expansion mismatch between a system board and an associated IC chip. Underfill materials require long processing time and when applied, it is difficult to rework the assembled part. These two factors make underfill a costly solution. Referring now to FIG. 3A, electrical contact is made between a CWLP 10 and a system board 40, such as a PWB, through the solder bumps 16 of the CWLP 10. FIG. 3B, shows the result of varying coefficients of thermal expansion between the system board 40 and the CWLP 10. In the case of the CWLP 10, the compliant interconnects 30 and compliant layer 14 are designed to physically expand and contract during temperature cycling, thereby accommodating relative motion between the system board 40 and the CWLP 10 and absorbing any thermo-mechanical stresses. In this way, compliant interconnects 30 not only provide electromechanical connection from the CWLP 10 to the system board 40, but they also replace the costly underfill process.

Figure 4A:
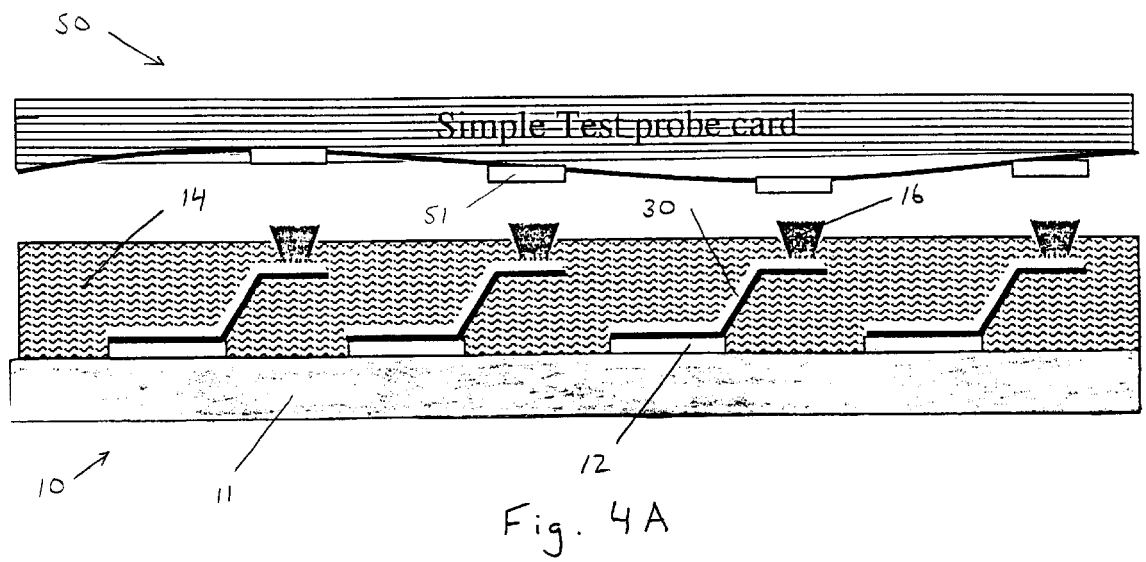
FIGS. 4A and 4B depict a side view of the vertical compliance provided by a compliant wafer level package as revealed in FIG. 1, when wafer level testability is conducted using test probe cards.
Figure 4B:
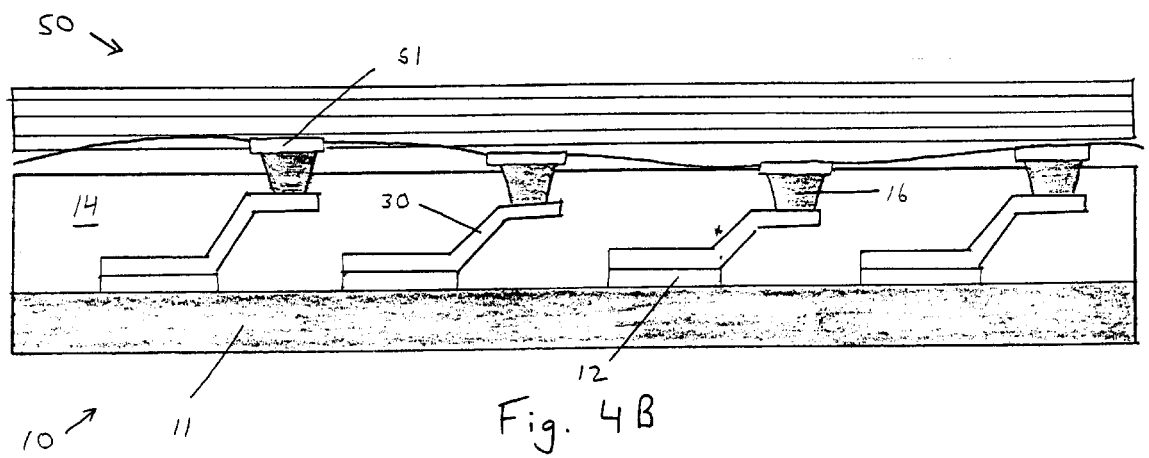

As well, the compliant layer 14 and compliant interconnects 30 are designed to be compliant in the vertical direction. As seen in FIGS. 4A and 4B, vertical compliance is necessary to be able to burn-in and perform reliability and AC/DC functional testing at wafer level. Because of non-planarity of test probe cards 50, some vertical force against the CWLP 10 would be used to make contact with all of the compliant interconnects 30 on the CWLP 10. If there were no vertical compliance in the package, the test probe 51 could jeopardize the functionality of the sensitive ICs. In case of the CWLP 10, the test probe 51 contacts the solder bumps 16, which are approximately 50 μm above the surface of substrate 11. The compliant interconnects 30 and compliant layer 14 physically deflect in the vertical direction as needed to make a firm contact to all of the probes 51 of the test probe card 50.

Figure 6A:
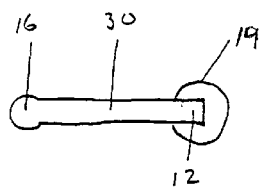
FIG. 6 shows a top perspective view of various possible forms that may be utilized for the compliant interconnects of the embodiments of the present invention.
Figure 6B:
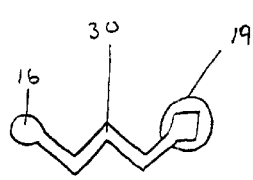
Figure 6C:
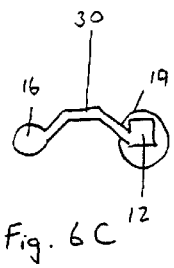
Figure 6D:
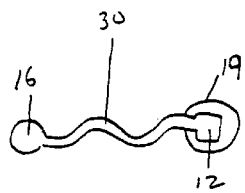
Figure 6E:
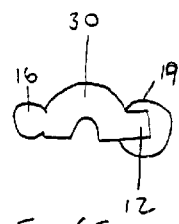
Figure 6F:
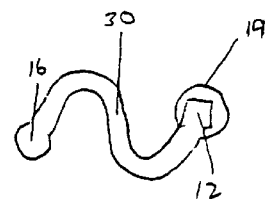
Figure 6G:
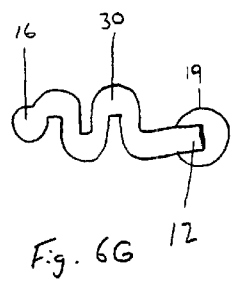
Figure 1:
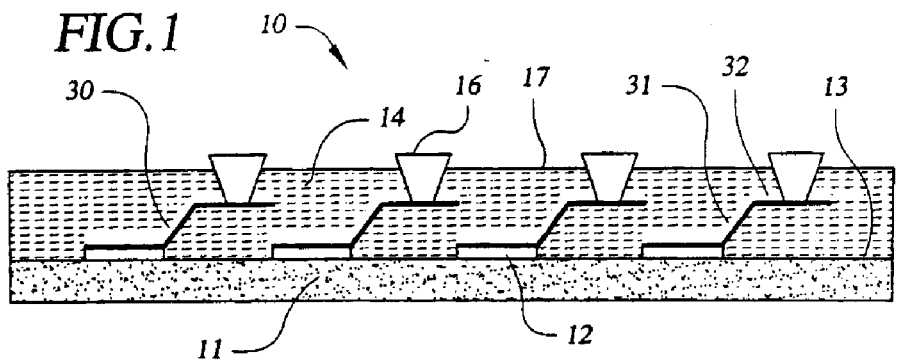
Figure 2A:
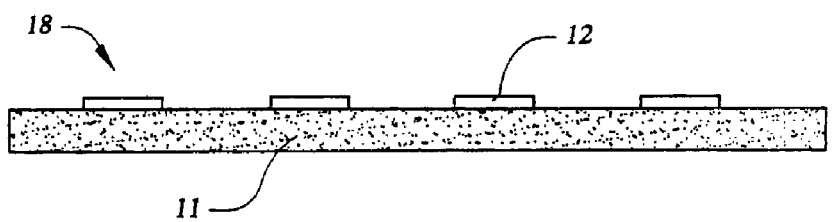
Figure 2B:
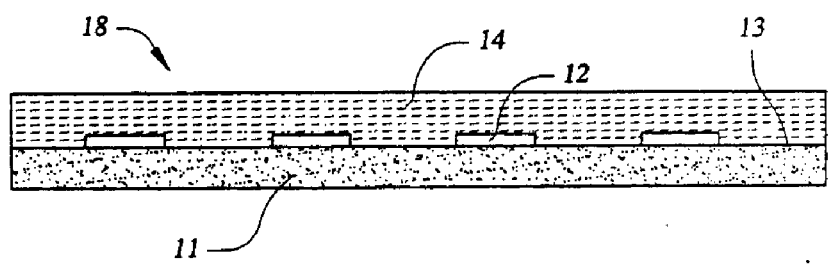
Figure 2C:
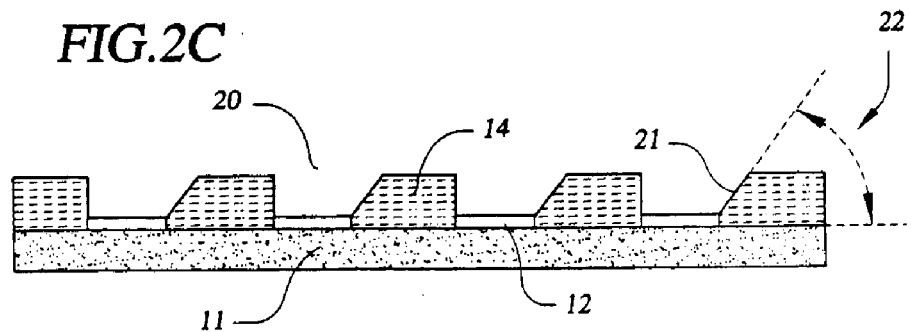
Figure 2D:
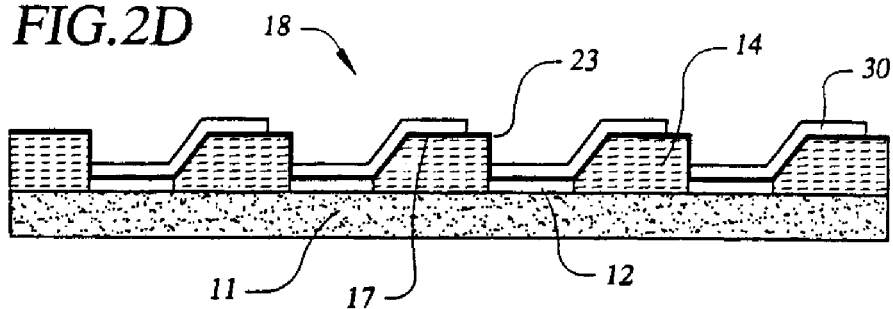
Figure 2E:
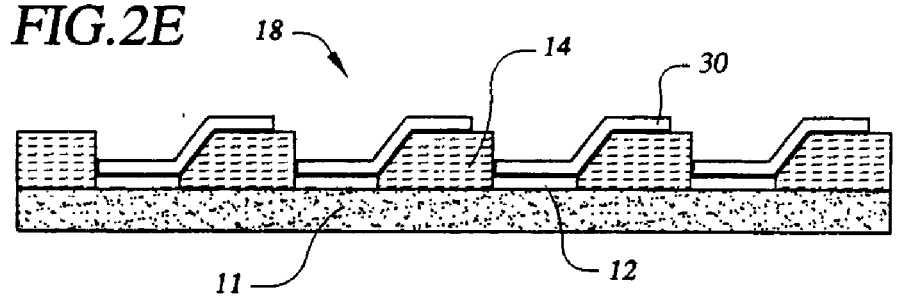
Figure 2F:
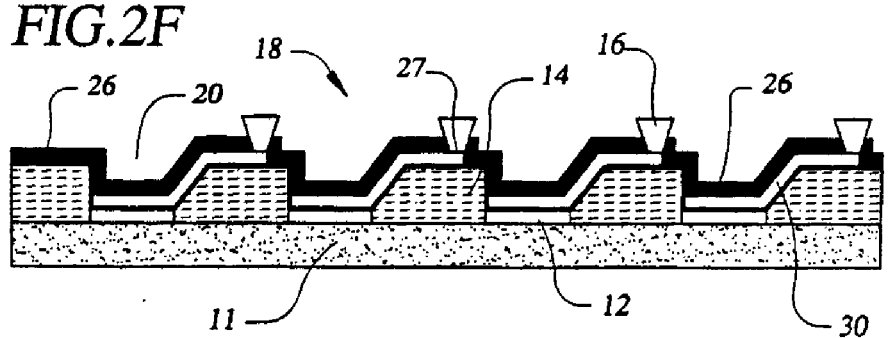
Figure 2G:
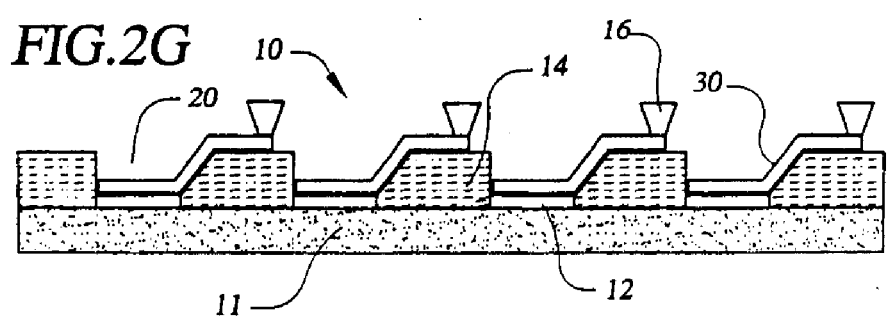
Figure 2H:
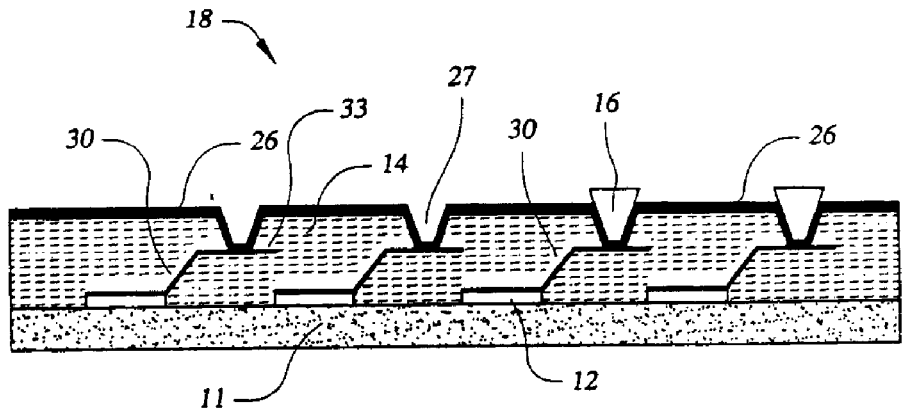
Figure 2I:
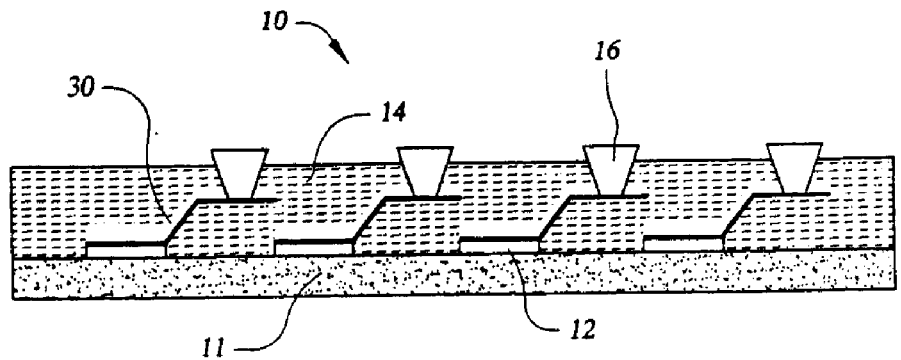
Figure 3A:
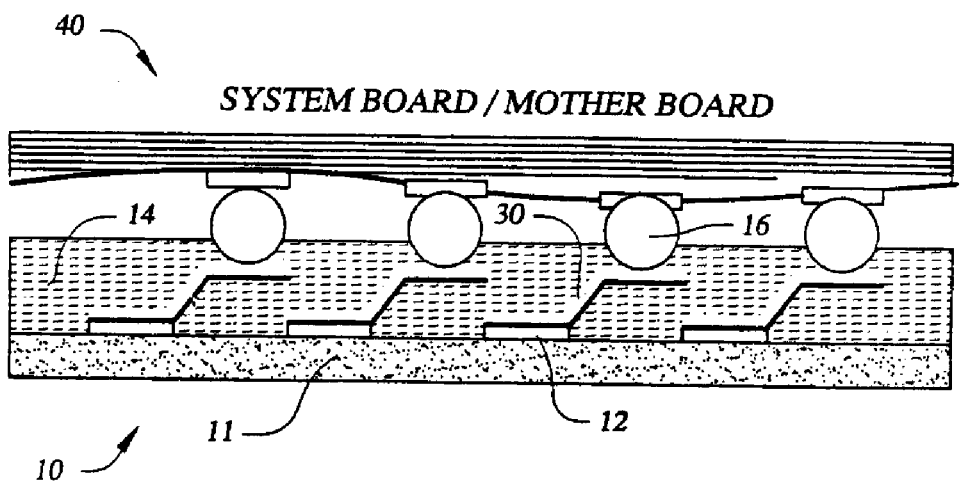
Figure 3B:
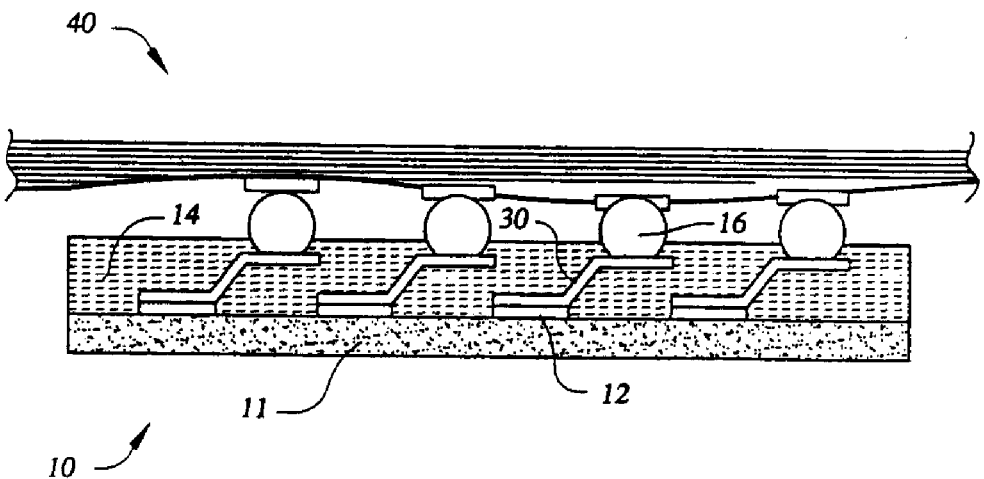
Figure 4A:
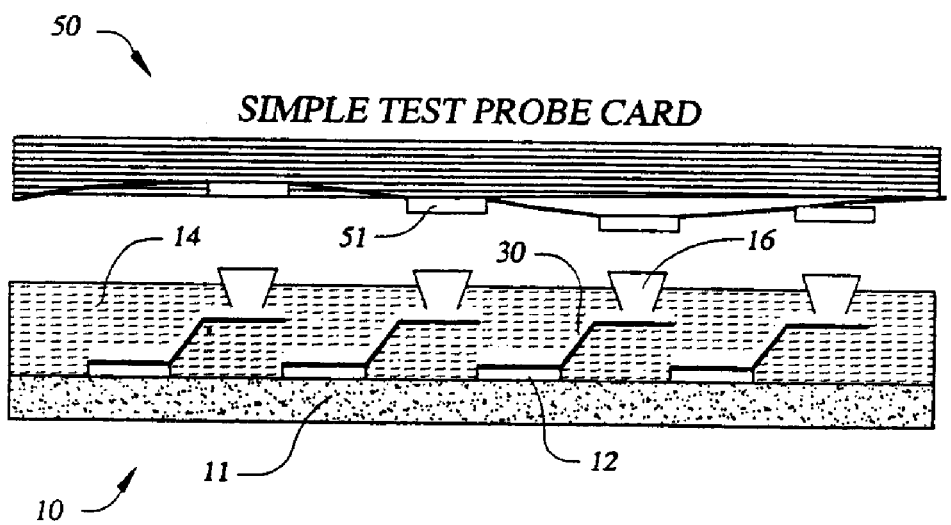
Figure 4B:
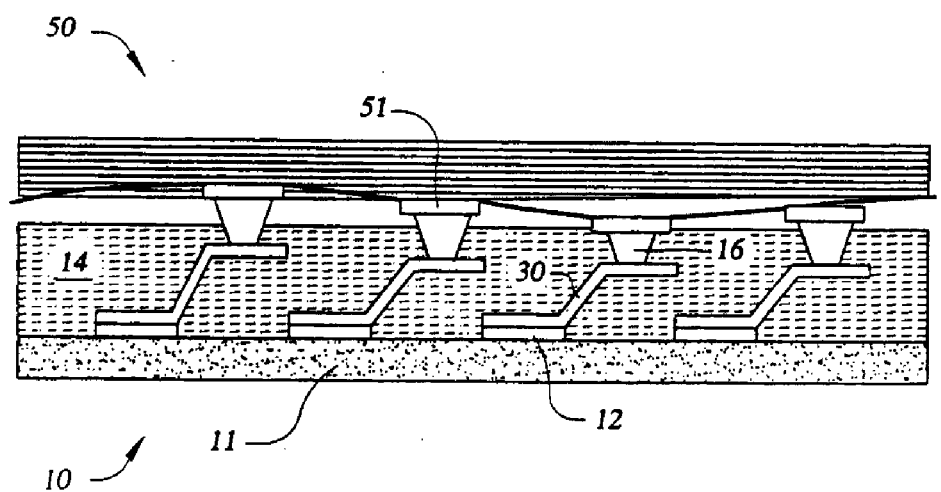
Figure 5:
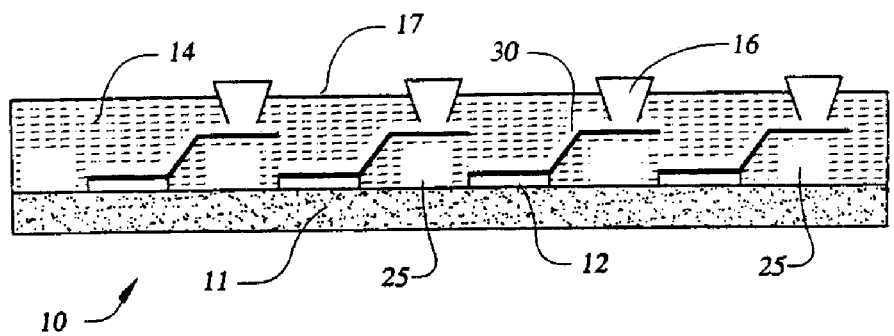
Figure 6A:
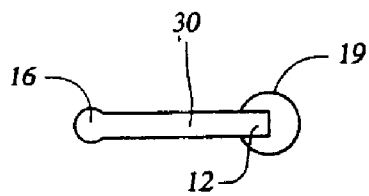
Figure 6B:
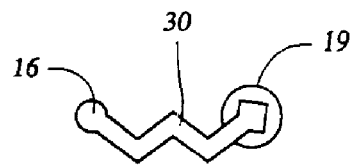
Figure 6C:
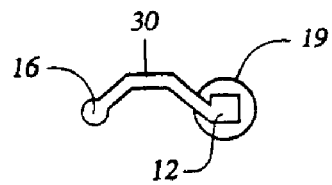
Figure 6D:
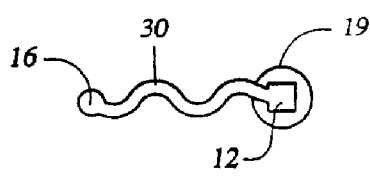
Figure 6E:
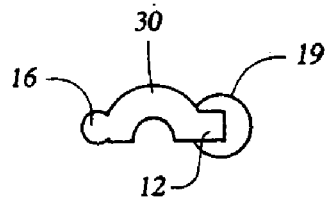
Figure 6F:
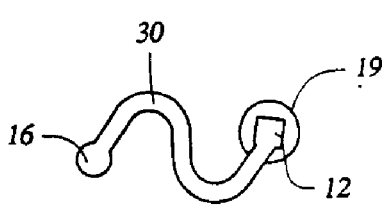
Figure 6G:
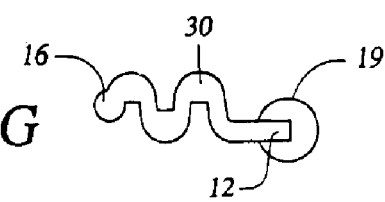

As noted earlier, FIGS. 6A–6G depict a number of shapes, as viewed from a top perspective, that may be used for the compliant interconnects 30. Each of FIGS. 6A–6G comprise a die pad 12, a via boundary etch 19, a compliant interconnect 30, and a solder bump 16 or other electrical connector. The shapes in FIGS. 6A–6B are only representative in that numerous shapes may be used for the compliant interconnect 30.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

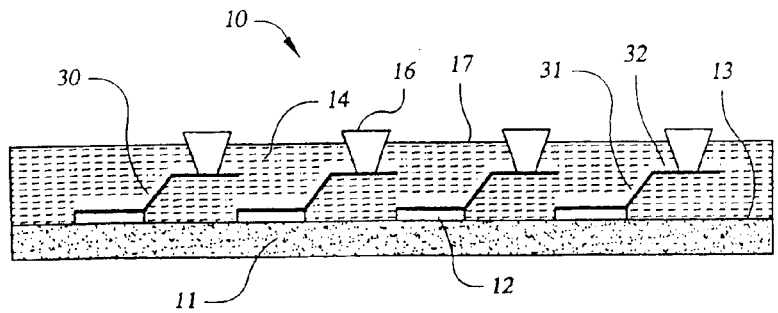

What is claimed is:

1. A method for monolithically fabricating compliant electronic device packages, comprising the steps of:
   providing a substrate having a compliant layer on a first side, the compliant layer having a via that exposes a die pad along the first side of the substrate; and
   fabricating a compliant interconnect so that a first end of the compliant interconnect contacts the die pad and a second end is disposed above an upper surface of the compliant layer.

2. The method of claim 1, wherein the step of fabricating the compliant interconnect further comprises the steps of:
   providing a substantially vertical portion of the compliant interconnect having the first end contacting the die pad and passing through the compliant layer; and
   providing a substantially horizontal portion of the compliant interconnect that contacts the upper surface of the compliant layer along the length of the substantially horizontal portion of the compliant interconnect.

3. The method of claim 2, wherein the substantially horizontal portion of the compliant interconnect is substantially linear in form.

4. The method of claim 2, wherein the substantially horizontal portion of the compliant interconnect is non-linear in form.

5. The method of claim 1, further comprising the step of encapsulating the compliant interconnect with a second compliant layer so that a second end of the compliant interconnect is exposed.

6. The method of claim 5, wherein the first and second compliant layers comprise a dielectric material.

7. The method of claim 1, wherein the step of exposing the die pads further comprises the steps of;
   using a photolithographic mask to pattern the first compliant layer; and
   etching a via in the compliant layer so that the die pad is exposed.

8. The method of claim 7, wherein a sidewall of the via defines an angle with the substrate measuring between 75 and 80 degrees.

9. The method of claim 7, further comprising the step of filling the via with a compliant material.

10. The method of claim 1, wherein the step of fabricating a compliant interconnect further comprises the step of electroplating a compliant interconnect using a photolithographic mask.

11. The method of claim 5, wherein the step of exposing the second end of the compliant interconnect further comprises the steps of:
   using a photolithographic mask to pattern the second compliant layer; and
   etching the second compliant layer to expose the second end of the compliant interconnet.

12. The method of claim 1, further comprising the step of disposing an electrical connector on the second end of the compliant interconnect.

13. The method of claim 1, further comprising the step of embedding integrated passives and decoupling capacitors in the compliant layer.

14. A method for fabricating electronic device packages, comprising the steps of:
   providing a substrate with a die pad disposed thereon;
   applying a layer of compliant polymeric material on a surface of the substrate containing the die pad;
   exposing the die pad;
   fabricating a compliant interconnect so that a first end of the compliant interconnect contacts the die pad and a second end of the compliant interconnect is disposed on an upper surface of the layer of compliant polymeric material;
   applying a second layer of compliant polymeric material so that the compliant interconnect is embedded in the compliant polymeric material;
   exposing the second end of the compliant interconnect; and disposing an electrical connector on the second end of the compliant interconnect.

15. The method of claim 14, wherein the step of exposing the die pads further comprises the steps of;
   using a photolithographic mask to pattern the compliant polymeric material; and etching a via in the compliant polymeric material so that the die pad is exposed.

16. The method of claim 15, wherein a sidewall of the via defines an angle with the substrate measuring between 75 and 80 degrees.

17. The method of claim 14, wherein the step of fabricating a compliant interconnect further comprises the steps of:
   depositing a blanket seed layer on the polymeric layer and the exposed die pad; and
   electroplating a compliant interconnect using a photolithographic mask.

18. The method of claim 14, wherein the step of exposing the second end of the compliant interconnect further comprises the steps of:
   using a photolithographic mask to pattern the polymeric material; and
   etching the polymeric material to expose the second end of the compliant interconnect.

19. The method of claim 14, wherein the step of disposing an electrical connector on the second end of the compliant interconnect further comprises the steps of:
   depositing a seed coat layer on the second end; and
   electroplating a solder bump on the second end.

20. The method of claim 14, further comprising the step of embedding integrated passives and decoupling capacitors in the polymeric material.

21. The method of claim 17, wherein the step of depositing a blanket seed layer further comprises sputter coating.

* * * * *

UNITED STATES PATENT AND TRADEMARK OFFICE
CERTIFICATE OF CORRECTION

PATENT NO.    : 6,528,349 B1
DATED         : March 4, 2003
INVENTOR(S)   : Patel et al.

It is certified that error appears in the above-identified patent and that said Letters Patent is hereby corrected as shown below:

Title page, under Item [57], ABSTRACT, replace "7" with -- 6 --.
The title page showing the illustrative figure should be replaced with the attached title page.

Delete drawing sheets 1-7 and replace with the attached drawing sheets 1-6.

Signed and Sealed this

Thirteenth Day of July, 2004

JON W. DUDAS
*Acting Director of the United States Patent and Trademark Office*

(12) United States Patent
Patel et al.

(10) Patent No.: US 6,528,349 B1
(45) Date of Patent: Mar. 4, 2003

(54) MONOLITHICALLY-FABRICATED COMPLIANT WAFER-LEVEL PACKAGE WITH WAFER LEVEL RELIABILITY AND FUNCTIONALITY TESTABILITY

(75) Inventors: Chirag S. Patel, Peekskill, NY (US); Kevin Martin, Atlanta, GA (US); James D. Meindl, Marietta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 09/697,031

(22) Filed: Oct. 26, 2000

Related U.S. Application Data

(60) Provisional application No. 60/161,437, filed on Oct. 26, 1999.

(51) Int. Cl.[7] .................. H01L 21/44; H01L 21/48; H01L 21/50
(52) U.S. Cl. .................. 438/117; 438/15; 438/106; 438/108; 438/117; 438/612; 438/613; 438/623; 438/624; 438/640
(58) Field of Search .................. 438/15, 612, 106, 438/613, 108, 623, 117, 624, 640

(56) References Cited

U.S. PATENT DOCUMENTS

| | | | | |
|---|---|---|---|---|
| 5,023,205 A | * | 6/1991 | Reche | 437/228 |
| 5,736,448 A | * | 4/1998 | Saia et al. | 438/393 |
| 6,187,615 B1 | * | 2/2001 | Kim et al. | 438/113 |
| 6,281,111 B1 | * | 8/2001 | Ohsumi | 438/623 |

OTHER PUBLICATIONS

Reed et al., Compliant Wafer Level Package (CWLP) With Embedded Air-gaps for Sea of Leads (SoL) Interconnections, School of Chemical Engineering, Georgia Institute of Technology, pp. 1–3.

Patel et al., Thermal Management in High Density 'Tiled' Compliant Wafer Level Packages, Microelectronics Research Center, Georgia Institute of Technology, pp. 1–21.

Patel et al., Optimal Printed Wiring Board Design For High I/O Density Chip Size Packages, Microelectronics Research Center, Georgia Institute of Technology, pp. 1–5.

Patel et al., Low Cost High Density Complaint Wafer Level Package, 2000 International Conf. on High–Density Interconnect and Systems Packaging, Apr. 26–28, 2000, Denver, Colorado, pp. 1–8.

Patel et al., Analysis of Thermal Management in the System Assembly of High Density Chip Size Packages, Microelectronics Research Center, Georgia Institute of Technology, pp. 32–39.

Patel et al., Reliability and Thermo–Mechanical Analysis of Complaint Wafer Level Package, Microelectronics Research Center, Georgia Institute of Technology, pp. 1–5.

(List continued on next page.)

Primary Examiner—Albert W. Paladini
Assistant Examiner—David A. Zarneke
(74) Attorney, Agent, or Firm—Thomas, Kayden, Horstemeyer & Risley, LLP

(57) ABSTRACT

Compliant wafer level packages 10 and methods for monolithically fabricating the same. A monolithically fabricated compliant wafer level package 10 having a compliant layer 14 and a compliant interconnect 30 passing therein. The compliant interconnects 30 being provided so that electrical and mechanical connections may be supported across the compliant layer 14, and constructed so that stresses related to relative motion between electrical components is accommodated. A method of providing a substrate 10 having a compliant layer 14, the compliant layer 14 having a via 20 that exposes a die pad 12 on the substrate 10. Fabricating a compliant interconnect 30 so that the compliant interconnect 30 contacts the die pad 12. The compliant interconnect 30 constructed so that electrical and mechanical connections may be supported through the compliant layer 14.

21 Claims, 7 Drawing Sheets